United States Patent [19]

Oitzl et al.

[11] Patent Number: 4,829,302
[45] Date of Patent: May 9, 1989

[54] ANALOG/DIGITAL CONVERTER USING THE WEIGHING METHOD

[75] Inventors: Erich Oitzl; Manfred Haas, both of Villach, Austria

[73] Assignee: Siemens Aktiengesellschaft, Berlin and Munich, Fed. Rep. of Germany

[21] Appl. No.: 91,539

[22] Filed: Aug. 31, 1987

[30] Foreign Application Priority Data

Sep. 20, 1986 [DE] Fed. Rep. of Germany ....... 3629830

[51] Int. Cl.⁴ .............................................. H03M 1/26
[52] U.S. Cl. .................................... 341/165; 341/155; 341/156
[58] Field of Search .......................... 341/156, 165, 172

[56] References Cited

U.S. PATENT DOCUMENTS 4,200,863 4/1980 Hodges ........................ 340/347 AD
4,407,020 9/1983 Helliwell et al. .................... 341/165
4,460,891 7/1984 Bernstein ............................ 341/156

OTHER PUBLICATIONS

Article by Jim Williams, EDN, 6/20/85, pp. 115–126.
Research Notes, Int. J. Electronics, 1974, vol. 37, No. 5, pp. 711–713.

Primary Examiner—William M. Shoop, Jr.
Assistant Examiner—Gary J. Romaro
Attorney, Agent, or Firm—Herbert L. Lerner; Laurence A. Greenberg

[57] ABSTRACT

A clock-controlled analog/digital converter operating according to the weighing method includes a sample-and-hold element with an analog input, a comparator having inputs and a successive approximation register having a data output. The sample-and-hold element, the comparator and the successive approximation register being mutually interconnected in series. The successive approximation register includes memory elements for incrementing a defined logical state for each successive weighing step as well as for writing in and storing in memory the particular result of weighing ascertained by the comparator. A digital/analog converter has an input side connected to the data output and an output side connected to one of the inputs of the comparator. A decoder controls the comparator and the successive approximation register and has an input side connected to the data output.

4 Claims, 1 Drawing Sheet

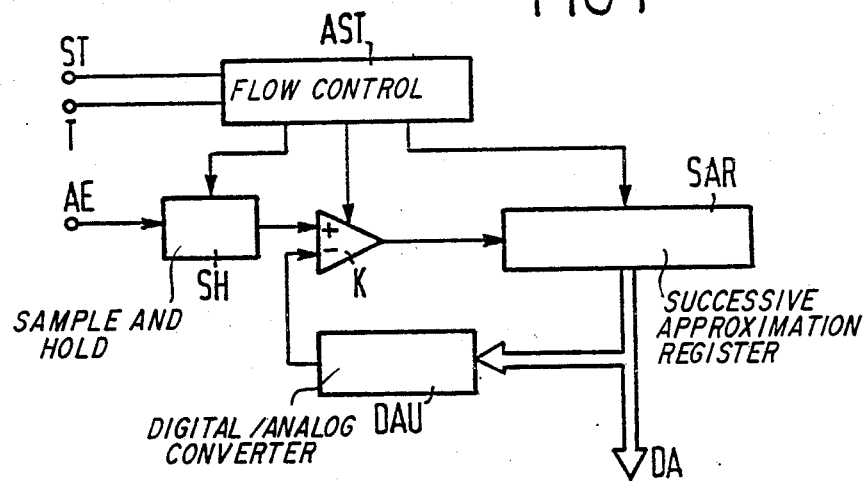
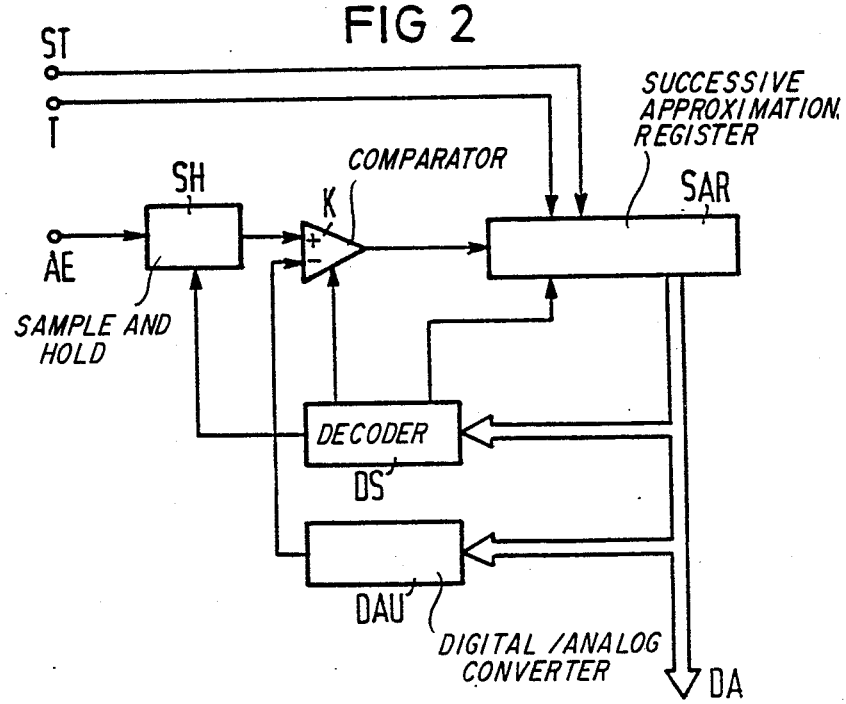

ANALOG/DIGITAL CONVERTER USING THE WEIGHING METHOD

The invention relates to an analog/digital converter operating according to the weighing method, including a sample-and-hold element with an analog input, a comparator, and a successive approximation register having a data output, which are mutually interconnected in series, the successive approximation register including memory elements for incrementing a defined logical state for each successive weighing step as well as for writing in and storing in memory the particular result of weighingascertained by the comparator, and a digital-/analog converter connected on the input side to the data output and on the output side to one input of the comparator.

An analog/digital converter of this kind is described, for instance, in the book entitled Halbleiter-Schaltungstechnik [Semiconductor Circuit Technology] by U. Tietze and Ch. Schenk, 7th revised edition, Springer-Verlag, Berlin, Heidelberg, New York, 1985, pages 767 et seq..

However, it is a disadvantage of the prior art devices that the control of the analog/digital converter is difficult and thus expensive.

It is accordingly an object of the invention to provide an analog/digital converter using the weighing method, which overcomes the hereinafore-mentioned disadvantages of the heretofore-known devices of this general type and which reduces the expenditure for the control of the analog/digital converter.

With the foregoing and other objects in view there is provided, in accordance with the invention, a clock-controlled analog/digital converter operating according to the weighing method, comprising a sample-and-hold element with an analog input, a comparator having inputs, a successive approximation register having a data output, the sample-and-hold element, the comparator and the successive approximation register being mutually interconnected in series, the successive approximation register including memory elements for shifting onward a defined logical state for each successive weighing step as well as for writing in and storing in memory the particular result of weighing ascertained by the comparator, a digital/analog converter having an input side connected to the data output and an output side connected to one of the inputs of the comparator, and a decoder controlling the comparator and the successive approximation register and having an input side connected to the data output.

In accordance with another feature of the invention, the sample-and-hold element is controlled by the decoder.

In accordance with a concomitant feature of the invention, the decoder decodes an incremented defined logical state of the successive approximation register and utilizes the result of the decoding for controlling the comparator, the successive approximation register and optionally the sample-and-hold element.

The invention is based on the concept of using the successive approximation register itself for flow control, in combination with a decoder. Doing so exploits the special property of the successive approximation register, which is that after a starting signal at the beginning of the conversion phase, a defined logical state is incremented in stages as a function of a clock pulse, beginning with the most significant bit.

Other features which are considered as characteristic for the invention are set forth in the appended claims.

Although the invention is illustrated and described herein as embodied in an analog/digital converter using the weighing method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is schematic and block circuit diagram of an analog/digital converter according to the prior art; and FIG. 2 is schematic and block circuit diagram of an analog/digital converter according to the invention.

Referring now to the figures of the drawings in detail and first, particularly, to FIG. 1 thereof, there is seen a prior art analog/digital converter of the type mentioned above which includes a sample-and-hold element SH, a comparator K, a successive approximation register SAR, a digital/analog converter DAU and flow control means AST. The sampe-and-hold element SH is used for temporary storage of a voltage value located at an analog input AE during a conversion time, so that all of the digit places of the output word that is present at the data output DA after the conversion are formed by the same input voltage. The comparator K compares the measured value stored in the sample-and-hold element SH with the output voltage of the digital/analog converter DAU.

At the beginning of the conversion of an analog input voltage, the memory elements of the successive approximation register are preset, so that the digital output word at a data output DA of the successive approximation register SAR equals zero. The most significant bit is then set to a defined logical state, in particular a logical "1" potential, and monitored as to whether the input voltage or the output voltage of the sample-and-hold element SH is higher than the output voltage of the digital/analog converter DAU, which corresponds to the digital word of the successive approximation register. If this is the case, then it remains set; otherwise, it is erased. This weighing process is repeated for each bit until the least significant bit is also defined at the end of the conversion phase.

The successive approximation register includes a shift register, in which the defined logical state is incremented by one position at each clock pulse. As a result, the bits are set empirically, in order, to the defined logical state. The result of a particular weighing process is also stored in memory elements, into which the applicable comparator state is read. Only the memory element having the associated bit which has just been tested, is made available in this process. Once the least significant bit has been defined, a further memory element of the shift register is typically set, in order to indicate that the conversion phase has been completed.

The conversion and optional signal sampling and holding must be controlled and this is typically accomplished with the aid of the flow control means AST as shown in FIG. 1. The flow control means AST resets the starting and clock signal present at inputs ST and T for controlling the comparator K and the functions of the successive approximation register SAR and it optionally controls the sample-and-hold element SH. To this end, the flow control means AST usually requires a control counter with a decoder.

The invention will be explained with reference to FIG. 2, in which elements identical to those in FIG. 1 are provided with the same reference numerals.

In accordance with the invention, the successive approximation register SAR is triggered directly by starting or clock signals through the inputs ST and T. In accordance with the invention, instead of specialized flow control means, the analog/digital converter has a decoder DS, the input side of which is connected to the data output DA and to the output of the successive approximation register SAR. The output side of the decoder DS controls the comparator K, the successive approximation register SAR itself, and optionally the sample-and-hold element SH.

In particular, the decoder DS decodes the defined logical state that has been incremented upon each clock signal in the successive approximation register SAR and utilizes the result of the decoding for controlling the elements listed. A concrete embodiment of the decoder DS for controlling the functions of incrementing the defined logical state, writing in and storing the result of weighing on the part of the comparator in the successive approximation register SAR and on the part of the other two elements, can easily be provided by one of ordinary skill in the art.

We claim:

1. Clock-controlled analog/digital converter operating according to the weighing method, comprising a sample-and-hold element with an analog input, a comparator having inputs, a successive approximation register having a plurality of data outputs, said sample-and-hold element, said comparator and said successive approximation register being mutually interconnected in series, said successive approximation register including memory elements for incrementing a defined logical state for each successive weighing step as well as for writing in and storing in memory the particular result of weighing ascertained by said comparator, a digital/analog converter having an input side connected to said plurality of data outputs and an output side connected to one of said inputs of said comparator, and a decoder controlling said comparator and said successive approximation register and having an input side connected to said plurality of data outputs.

2. Analog/digital converter according to claim 1, wherein said sample-and-hold element is controlled by said decoder.

3. Analog/digital converter according to claim 1, wherein said decoder decodes an incremented defined logical state of said successive approximation register and utilizes the result of the decoding for controlling said comparator and said successive approximation register.

4. Analog/digital converter according to claim 2, wherein said decoder decodes an incremented defined logical state of said successive approximation register and utilizes the result of the decoding for controlling said comparator, said successive approximation register, and said sample-and-hold element.

* * * * *